United States Patent
Yang et al.

(10) Patent No.: US 10,361,257 B2
(45) Date of Patent: Jul. 23, 2019

(54) ORGANIC LIGHT-EMITTING DISPLAY DEVICE AND METHOD OF MANUFACTURING THE SAME

(71) Applicant: LG Display Co., Ltd., Seoul (KR)

(72) Inventors: Hee-Jung Yang, Goyang-si (KR); Woo-Sup Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/794,378

(22) Filed: Oct. 26, 2017

(65) Prior Publication Data

US 2018/0190737 A1   Jul. 5, 2018

(30) Foreign Application Priority Data

Dec. 30, 2016 (KR) .......................... 10-2016-0183980

(51) Int. Cl.
| | |
|---|---|
| H01L 27/32 | (2006.01) |
| H01L 51/10 | (2006.01) |
| H01L 51/56 | (2006.01) |
| H01L 51/00 | (2006.01) |

(52) U.S. Cl.
CPC ...... *H01L 27/3246* (2013.01); *H01L 27/3248* (2013.01); *H01L 27/3258* (2013.01); *H01L 27/3276* (2013.01); *H01L 51/0005* (2013.01); *H01L 51/105* (2013.01); *H01L 51/56* (2013.01)

(58) Field of Classification Search
None
See application file for complete search history.

(56) References Cited

U.S. PATENT DOCUMENTS

| 8,890,406 | B2 | 11/2014 | Kang et al. |
| 2004/0256979 | A1 | 12/2004 | Murakami et al. |
| 2005/0116631 | A1 | 6/2005 | Kim et al. |
| 2006/0017671 | A1 | 1/2006 | Yamada |

(Continued)

FOREIGN PATENT DOCUMENTS

| JP | 2004-192876 A | 7/2004 |
| JP | 2006-038986 A | 2/2006 |

(Continued)

OTHER PUBLICATIONS

Extended European Search Report issued in counterpart European Patent Application No. 17194492.9 dated Apr. 17, 2018.

(Continued)

*Primary Examiner* — Herve-Louis Y Assouman
(74) *Attorney, Agent, or Firm* — Morgan, Lewis & Bockius LLP (57) ABSTRACT

Disclosed are an organic light-emitting display device and a method of manufacturing the same. The organic light-emitting display device includes a thin-film transistor including source and drain electrodes, a first electrode formed by extending the source or drain electrode, a passivation layer and a bank insulation layer on the thin-film transistor configured to expose the first electrode so as to define an emission area, an organic light-emitting layer provided on the first electrode, and a second electrode configured to cover the organic light-emitting layer. The source or drain electrode includes a plurality of layers and the first electrode is integrally formed with any one layer portion of the source or drain electrode.

8 Claims, 4 Drawing Sheets

(56) References Cited

U.S. PATENT DOCUMENTS

| | | | |
|---|---|---|---|
| 2007/0132365 A1 | 6/2007 | Kang et al. | |
| 2008/0042550 A1 | 2/2008 | Matsuura et al. | |
| 2008/0111484 A1 | 5/2008 | Kwon et al. | |
| 2008/0251785 A1* | 10/2008 | Noh | H01L 27/12 257/40 |
| 2009/0278131 A1 | 11/2009 | Kwon et al. | |
| 2010/0032186 A1* | 2/2010 | Gotou | G02F 1/13439 174/126.2 |
| 2014/0139102 A1 | 5/2014 | Jeon et al. | |
| 2015/0187948 A1 | 7/2015 | Misaki | |

FOREIGN PATENT DOCUMENTS

| | | |
|---|---|---|
| JP | 2007-164183 A | 6/2007 |
| JP | 2008-015293 A | 1/2008 |
| TW | 201003924 A1 | 1/2010 |
| WO | 2014/017406 A1 | 1/2014 |

OTHER PUBLICATIONS

Office Action dated Sep. 11, 2018, from the Taiwanese Patent Office in related Taiwanese 106133209. Note: US 2008/0042550 cited therein is already of record.
Office Action dated Aug. 28, 2018, from the Japanese Patent Office in related Japanese 2017-198332. Note: US 2014/0139102 and US 2008/0111484 cited therein is already of record.

* cited by examiner

ORGANIC LIGHT-EMITTING DISPLAY DEVICE AND METHOD OF MANUFACTURING THE SAME

CROSS-REFERENCE TO RELATED APPLICATIONS

This application claims the benefit of Republic of Korea Patent Application No. 10-2016-0183980, filed on Dec. 30, 2016, which is hereby incorporated by reference in its entirety.

BACKGROUND

Technical Field

The present invention relates to an organic light-emitting display device and a method of manufacturing the same, and more particularly, to an organic light-emitting display device and a method of manufacturing the same, which may simplify a process by reducing the number of masks when forming the organic light-emitting display device, and may increase reliability when forming an organic light-emitting layer by a solution process.

Discussion of the Related Art

An image display device, which realizes various pieces of information on a screen, is a core technology of the information and communication age, and is being developed in the direction of becoming thinner, lighter, more portable, and having higher performance. In response, as a flat panel display device that is thinner and lighter than a cathode ray tube (CRT), for example, an organic light-emitting display device, which controls the amount of light emitted from an organic light-emitting layer to display an image, is in the spotlight.

In an organic light-emitting display device, a plurality of pixels is arranged in a matrix form to display an image. Here, each pixel includes a light-emitting element, and a pixel drive circuit including, for example, a plurality of transistors and storage capacitors to independently drive the light-emitting element. Here, each light-emitting element includes an organic light-emitting layer between a first electrode and a second electrode.

The organic light-emitting layer is configured such that a plurality of layers such as, for example, a hole injection layer, a hole transport layer, an emission layer, an electron transport layer, and an electron injection layer are stacked one above another. The organic light-emitting layer has been manufactured by depositing these layers via thermal deposition in different process chambers. However, this related art method of manufacturing the organic light-emitting layer entails high manufacturing costs and a complicated manufacturing process and is difficult to use to realize a large-area mask.

In order to solve the problems, a technique of forming an organic light-emitting layer using a solution process such as, for example, ink-jet printing or nozzle coating has been proposed.

The organic light-emitting layer formed using the solution process undergoes a pile-up phenomenon in which the organic light-emitting layer is relatively slowly cured in the edge portion thereof and begins to be cured from the central portion thereof, thus causing the edge portion of the organic light-emitting layer to be thicker than the central portion. In order to solve this problem, a technique of forming a bank layer, which defines a pixel portion, in double layers so that a lower layer forms a hydrophilic bank and an upper layer forms a hydrophobic bank in order to reduce the difference in thickness between the central portion and the edge portion of the organic light-emitting layer has been proposed. However, when the bank layer is formed to have a double-layered structure, this may cause a complicated process and high manufacturing costs, and may also cause, for example, separation of the upper bank layer due to the low adhesive strength between the hydrophilic lower bank layer and the hydrophobic upper bank layer.

SUMMARY

Accordingly, the present invention is directed to an organic light-emitting display device and a method of manufacturing the same that substantially obviate one or more problems due to limitations and disadvantages of the related art.

An object of the present invention is to provide an organic light-emitting display device and a method of manufacturing the same, which may simplify a process by reducing the number of masks when forming the organic light-emitting display device, and may increase reliability when forming an organic light-emitting layer by a solution process.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light-emitting display device comprises a thin-film transistor including a source electrode and a drain electrode, a first electrode formed by extending one of the source electrode and the drain electrode, a passivation layer configured to cover the thin-film transistor and to expose the first electrode so as to define an emission area, a bank insulation layer provided on the passivation layer, an organic light-emitting layer provided on the first electrode, and a second electrode configured to cover the organic light-emitting layer.

In another aspect, a method of manufacturing an organic light-emitting display device comprises forming a semiconductor layer, forming a gate insulation layer and a gate electrode and forming a source area and a drain area by configuring the semiconductor layer as a conductor, and forming an interlayer insulation layer to cover the semiconductor layer, the interlayer insulation layer having first and second contact holes configured to expose the source area and the drain area.

The method further includes sequentially forming a first division layer and a second division layer using different transparent conductive materials and a third division layer using a metal material on the interlayer insulation layer, and forming a source electrode and a drain electrode by patterning the first to third division layers and extending the first and second division layers of one of the source electrode and the drain electrode to an emission area.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION

Hereinafter, exemplary embodiments of the present invention will be described with reference to the accompanying drawings. In the entire specification, the same or similar elements are denoted by the same reference numerals even though they are depicted in different drawings. In the following description of the present invention, a detailed description of known functions and configurations incorporated herein will be omitted when it may make the subject matter of the present invention rather unclear. Also, the terms used in the following description are terms defined taking into consideration the functions obtained in accordance with the present invention, and may differ from the names of parts of actual products.

In the case of a description with respect to positional relations, when an element is referred to as being, for example, "on", "above", "under", and "aside" another element, it may be directly on the other element or intervening elements may also be present.

Although terms such as, for example, "first" and "second" are used to describe various components, these components are not limited by these terms. These terms are merely used to distinguish any one component from another component. Thus, "a first component" mentioned below may be "a second component" within the technical sprit of the present invention.

In the drawings, the thickness and size of each component are illustrated for convenience of description, and the present invention is not necessary to be limited to the size and thickness of the illustrated component.

Figure 1:
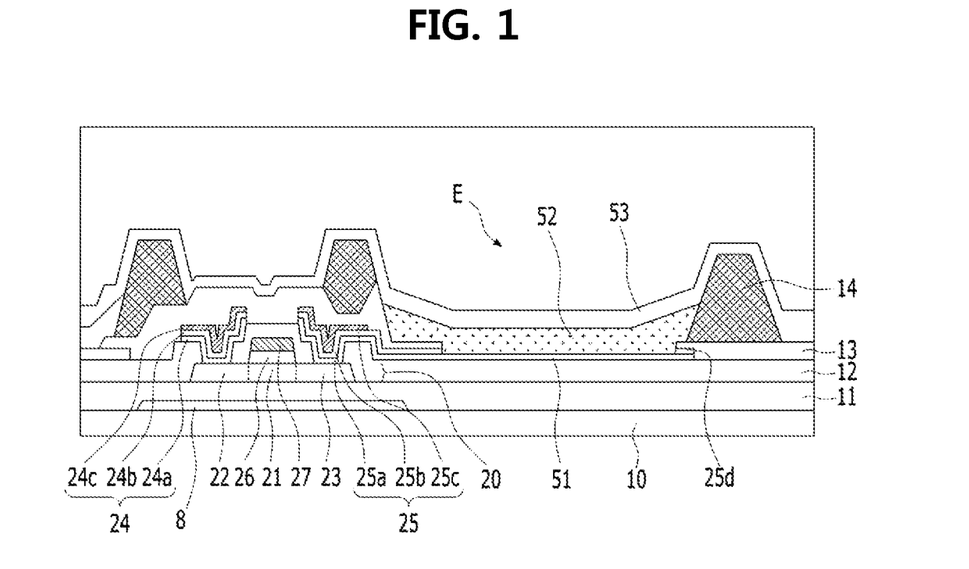
FIG. 1 is a view illustrating an organic light-emitting display device according to an embodiment of the present invention.

FIG. 1 is a cross-sectional view illustrating an organic light-emitting display device according to the present invention.

The organic light-emitting display device according to the present invention includes a thin-film transistor T, and a first electrode 51, an organic light-emitting layer 52, and a second electrode 53, which are electrically connected to the thin-film transistor T.

The organic light-emitting display device according to an embodiment of the present invention will be described below in more detail with reference to FIG. 1. Referring to FIG. 1, a buffer layer 11 is located on a first substrate 10. The buffer layer 11 serves to prevent the permeation of moisture or impurities through the first substrate 10 and to flatten the top of the first substrate 10. The buffer layer 10 may be formed of an inorganic insulation material such as, for example, SiNx or SiOx.

An active layer 20 is formed on the buffer layer 11 using semiconductors, such as, for example, silicon or a semiconductor oxide. A gate insulation layer 26 is located on the active layer 20, and a gate electrode 27 is located on the gate insulation layer 26. The gate electrode 27 is located to overlap a channel area 21 of the active layer 20 with the gate insulation layer 26 interposed therebetween. The gate electrode 27 may be formed in a single layer or in multiple layers using any one or an ally thereof selected from among molybdenum (Mo), aluminum (Al), chrome (Cr), gold (Au), titanium (Ti), nickel (Ni), neodymium (Nd) and copper (Cu).

A shied layer 8 is located below the area in which the thin-film transistor T is located. The shield layer 8 may serve to prevent light from being introduced into the active layer 20 and to reduce parasitic capacitance generated between the thin-film transistor T and various lines (not illustrated). The shield layer 8 may be formed of any one or an alloy thereof selected from among silver (Ag), nickel (Ni), gold (Au), platinum (Pt), aluminum (Al), copper (Cu), molybdenum (Mo), titanium (Ti) and neodymium (Nd).

An interlayer insulation layer 12 is located on the gate electrode 27. The interlayer insulation layer 12 extends from a display area and is located throughout one surface of the first substrate 10 including a lower pad portion of a pad area. The interlayer insulation layer 12 may be formed in a single layer or in multiple layers using an inorganic insulation material such as, for example, SiNx or SiOx.

The interlayer insulation layer 12 has a first contact hole H1, which exposes a source area 22 of the active layer 20, and a second contact hole H2, which exposes a drain area 23.

A source electrode 24 is connected to the source area 22 through the first contact hole H1, and a drain electrode 25 is connected to the drain area 23 through the second contact hole H2.

The source electrode 24 has a triple-layer structure including a lower layer portion 24a, a middle layer portion 24b, and an upper layer portion 24c. In the same manner as the source electrode 24, the drain electrode 25 also has a triple-layer structure including a lower layer portion 25a, a middle layer portion 25b, and an upper layer portion 25c.

The lower layer portions 24a and 25a, and the middle layer portions 24b and 25b are formed of different transparent conductive materials. For example, when the lower layer portions 24a and 25a are formed of ITO, the middle layer portions 24b and 25b may be formed of a transparent conductive material such as IZO or IGZO.

When the lower layer portions 24a and 25a is formed of a transparent conductive material such as IZO or IGZO, the middle layer portions 24b and 25b may be formed of ITO. This serves to ensure that the first electrode 51, which will be described below, is integrally formed with the lower layer portion 24a of the source electrode 24 or the lower layer portion 25a of the drain electrode 25 and the middle layer portion 24b or 25b covers the top of the first electrode 51 before the light-emitting layer 52 is formed, thereby protecting the surface of the first electrode 51 from impurities. Then, after the first electrode 51 is formed, the middle layer portion on the first electrode 51 is removed. A detailed description related to this will follow.

The upper layer portion 24c of the source electrode 24 and the upper layer portion 25c of the drain electrode 25 may be formed of a metal such as, for example, molybdenum (Mo), aluminum (Al), chrome (Cr), gold (Au), titanium (Ti), nickel (Ni), neodymium (Nd) or copper (Cu).

In addition, the first electrode 51 is formed on the interlayer insulation layer 12 so as to be integrally formed with one of the lower layer portion 24a of the source electrode 24 and the lower layer portion 25a of the drain electrode 25. Although the embodiment of FIG. 1 illustrates the first electrode 51 as being integrally formed with the lower layer portion 25a of the drain electrode 25, in some cases, the first electrode 51 may be integrally formed with the lower layer portion 24a of the source electrode 24. Herein, the first electrode 51 will be described as being integrally formed with the lower layer portion 25a of the drain electrode 25.

A passivation layer 13 is provided on the thin-film transistor T so as to expose the first electrode 51. The passivation layer 13 may be formed in a single inorganic layer or in multiple inorganic layers formed of a hydrophilic material such as, for example, SiOx or SiNx. In the present invention, the passivation layer 13 serves not only to protect the thin-film transistor T, but also to define an emission area E. That is, the passivation layer 13 is provided to cover the edge portion of the first electrode 51 and defines the emission area E.

A bank insulation layer 14 is formed on the passivation layer 13. The bank insulation layer 14 may be formed using a hydrophobic organic insulation material. Examples of a constituent material of the bank insulation layer 14 may include any one or a mixture of two or more selected from among polyimide, styrene, metylmethacrylate, and polytetrafluoroethylene. Since the bank insulation layer is formed of a hydrophobic organic insulation material, the bank insulation layer 14 may serve as a barrier that prevents a liquid-phase material of the light-emitting layer from being sprayed to the emission area E due to, for example, equipment malfunction when the light-emitting layer 52 is formed. In addition, even if the liquid-phase material of the organic light-emitting layer 52 is sprayed onto the bank insulation layer 14 due to a processing error, the bank insulation layer 14 causes the liquid-phase material of the organic light-emitting layer 52 to fall down, thereby being located in the emission area E, rather than overflowing from the bank insulation layer 14.

The organic light-emitting layer 52 is provided on the first electrode 51. Here, the organic light-emitting layer 52 may include a hole injection layer (HIL), a hole transport layer (HTL), an emission layer (EML), an electron transport layer (ETL) and an electron injection layer (EIL). In addition, the organic light-emitting layer 52 may further include at least one functional layer configured to increase, for example, the luminous efficacy and lifespan of the emission layer, for example, a charge-generating layer, which generates a charge, an additional electron transport layer and an additional hole transport layer.

The organic light-emitting layer 52 is formed by a solution process such as inkjet printing or nozzle coating. The organic light-emitting layer formed using the solution process undergoes a pile-up phenomenon in which the organic light-emitting layer is relatively slowly cured in the edge portion thereof, which is in contact with the bank insulation layer 14 and begins to be cured from the central portion thereof, whereby the constituent material of the organic light-emitting layer 52 moves to the edge portion and the edge portion is finally cured, thus causing the edge portion of the organic light-emitting layer 52 to be thicker than the central portion. The edge portion of the organic light-emitting layer 52 is thicker than the central portion of the organic light-emitting layer 52.

The organic light-emitting display device according to one embodiment is configured such that the passivation layer 13 extends to the bottom of the organic light-emitting layer 52. Thereby, the organic light-emitting layer 52 has the area located on the passivation layer 13, and due to the resulting stepped portion between the passivation layer 13 and the first electrode 51, the passivation layer 13 causes the liquid-phase constituent material of the organic light-emitting layer 52 to gather at the central portion. Thereby, the organic light-emitting display device according to one embodiment may somewhat alleviate a phenomenon in which the organic light-emitting layer 52 is thicker in the portion thereof that is close to the bank insulation layer 14.

It may reduce the thickness difference between the edge portion and the central portion of the organic light-emitting layer 52.

The second electrode 53 is provided to cover the top of the organic light-emitting layer 52 and the bank insulation layer 14. When the first electrode 51 serves as an anode electrode, the second electrode 53 serves as a cathode electrode. In a top-emission-type organic light-emitting display device, the second electrode 53 may be formed of a metallic material having a low work function to an extremely small thickness (e.g., about 200 Å or less) that allows the transmission of light, whereby light from the organic light-emitting layer 52 may penetrate the second electrode 53, thus realizing top emission. The constituent material of the second electrode 53 may be at least one of, for example, silver (Ag), titanium (Ti), aluminum (Al), molybdenum (Mo), and an ally of silver (Ag) and magnesium (Mg). In addition, when the second electrode 53 is formed of a transparent conductive material such as, for example, ITO, IZO, IGZO, or ZnO, the light from the organic light-emitting layer 52 may penetrate the second electrode 53, thus realizing top emission.

Although a second substrate (not illustrated) may be bonded onto the second electrode 53 via an adhesive layer (not illustrated), the adhesive layer and the second substrate may be omitted according to design, and the second substrate may be replaced with an encapsulation member having the form of a thin layer.

Referring to FIG. 1, in the organic light-emitting display device according to the embodiment of the present invention, as described above, the lower layer portion 25a of the drain electrode 25 extends to form the first electrode 51, the middle layer portion 25b of the drain electrode 25 is provided below the passivation layer 13 and extends to the bottom of the organic light-emitting layer 52, and the side surface end of the middle layer portion 25b of the drain electrode 25 is in contact with the organic light-emitting layer 52. Meanwhile, a dummy conductive layer 25d may further be provided below the passivation layer 13 at one side of the organic light-emitting layer 52 opposite the other side that is in contact with the middle layer portion 25b of the drain electrode 25.

Although the drain electrode 25 has been described in the embodiment of FIG. 1, in some designs, the lower layer portion 24a of the source electrode 24 extends to form the first electrode 51, the middle layer portion 24b of the source electrode 24 is provided below the passivation layer 13 so that the side surface end of the middle layer portion 24b of the source electrode 24 is in contact with the organic light-emitting layer 52. Hereinafter, the example in which the lower layer portion 25a of the drain electrode 25 forms the first electrode 51 will be continuously described.

The reason why the middle layer portion 25b of the drain electrode 25 is formed so as to extend along the bottom of the passivation layer 13 and the dummy conductive layer 25d is provided at one side of the organic light-emitting layer 52 opposite the other side that is in contact with the middle layer portion 25b of the drain electrode 25 is that the middle layer portion 25b of the drain electrode 25 remains on the first electrode 51 in order to protect the surface of the first electrode 51 until the bank insulation layer 14 is formed, and after the bank insulation layer 14 is formed, the middle layer portion 25b of the drain electrode 25 on the first electrode 51 is patterned to expose the first electrode and a portion of the middle layer portion 25b of the drain electrode 25 remains below the bank insulation layer 14.

As a result, in the organic light-emitting display device according to the embodiment, impurities such as, for example, particulates, which are generated in the process of forming the bank insulation layer 14 and are attached to the middle layer portion 25b of the drain electrode 25, are wholly removed in the process of patterning the middle layer portion 25b of the drain electrode 25 and no impurities remain on the surface of the first electrode 51, which may increase the adhesion strength between the first electrode 51 and the organic light-emitting layer 52. Here, the lower layer portion 25a and the middle layer portion 25b of the drain electrode 25 are formed using different transparent conductive materials. For example, when the lower layer portion 25a of the drain electrode 25 is formed of ITO, the middle layer portion 25b may be formed of IZO or IGZO. Conversely, when the lower layer portion 25a of the drain electrode 25 is formed of IZGO or IZO, the middle layer portion 25b may be formed of ITO. This serves to allow the middle layer portion 25b of the drain electrode 25 exposed on the top of the first electrode 51 to be selectively etched since the first electrode 51 and the middle layer portion 25b of the drain electrode 25 extending to the top of the first electrode 51 are formed of different transparent conductive materials. This feature will be described below in detail when the method of manufacturing the organic light-emitting display device according to the present invention is described.

FIGS. 2A to 2G are schematic views for explaining the method of manufacturing the organic light-emitting display device according to the present invention.

Figure 2A:
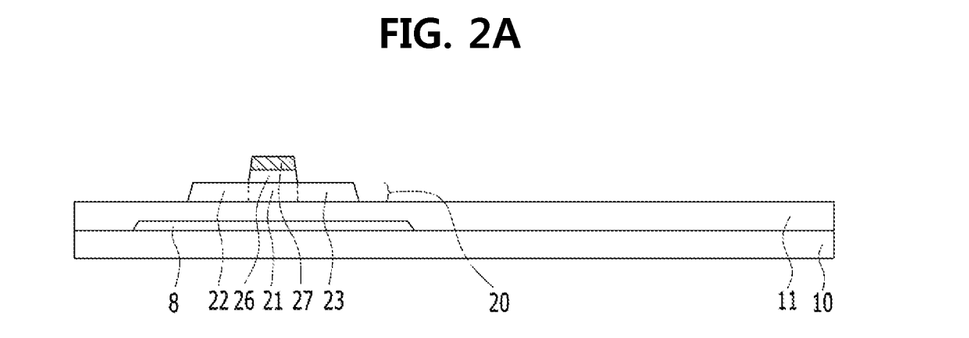
FIGS. 2A to 2G are views for explaining a method of manufacturing an organic light-emitting display device according to an embodiment of the present invention.

Referring to FIG. 2A, first, the shield layer 8 is formed on the first substrate 10, and then the buffer layer 11 is formed throughout one surface of the first substrate 10 via, for example, deposition so as to cover the top of the shield layer 8. The shield layer 8 may be formed by depositing any one or an alloy thereof selected from among silver (Ag), nickel (Ni), gold (Au), platinum (Pt), aluminum (Al), copper (Cu), molybdenum (Mo), titanium (Ti) and neodymium (Nd), and then patterning the same. Then, the active layer 20 is formed on the buffer layer 11 using a semiconductor material. The gate insulation layer 26 and the gate electrode 27 are sequentially formed on the channel area 21 of the active layer 20. The gate electrode 27 may be formed by depositing a second metal layer (not illustrated), which is formed in a single layer or in multiple layers using any one or an alloy thereof selected from among molybdenum (Mo), aluminum (Al), chrome (Cr), gold (Au), titanium (Ti), nickel (Ni), neodymium (Nd) and copper (Cu), and then patterning the same.

Subsequently, the source area 22 and the drain area 23 are formed by doping the active layer 20 with impurities using the gate electrode 27 as a mask. When the active layer 20 is formed of a semiconductor oxide, opposite sides of the active layer 20 may be configured as conductors via, for example, plasma processing, whereby the source and drain areas 22 and 23 may be formed.

Figure 2B:
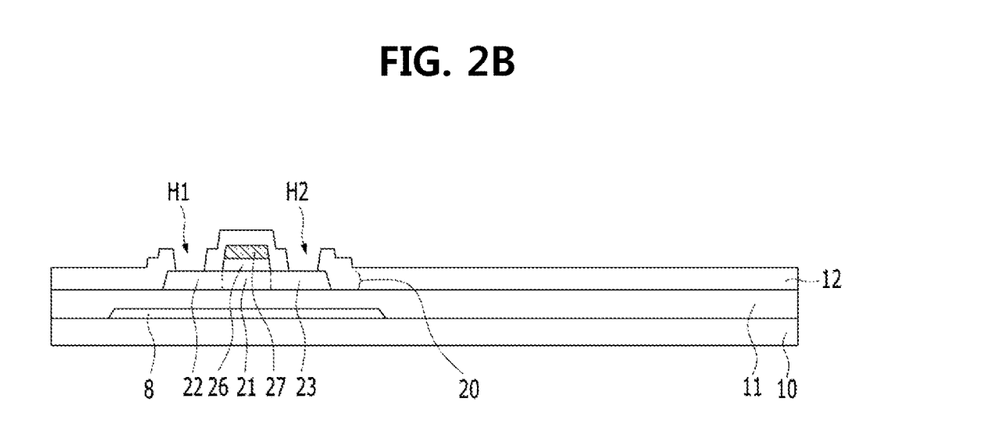

Subsequently, referring to FIG. 2B, the interlayer insulation layer 12 is formed on the entire surface of the first substrate 10 over the gate electrode 27. The interlayer insulation layer 12 may be formed of an inorganic insulation material in the same manner as the buffer layer 11. Then, the interlayer insulation layer 12 is patterned to form the first contact hole H1, which exposes the source area 22, and the second contact hole H2, which exposes the drain area 23.

Figure 2C:
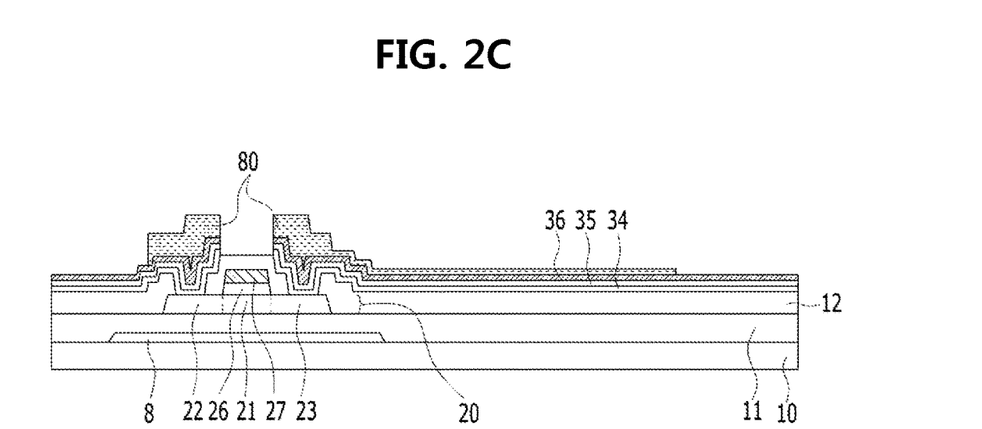

Subsequently, referring to FIG. 2C, a first division layer 34 and a second division layer 35, which are formed of different transparent conductive materials, and a third division layer 36, which is formed of a metal material, are sequentially deposited on the entire surface of the substrate 10 having therein the first contact hole H1 and the second contact hole H2. Then, after a photoresist 80 is formed, the photoresist 80 is patterned using a halftone mask. At this time, the photoresist 80 is thickly formed on the area in which the source electrode 24 and the drain electrode 25 (see FIG. 1) are to be formed, and is thinly formed on the area in which the first electrode 51 (see FIG. 1) is to be located.

The first division layer 24 and the second division layer 25 are formed of different transparent conductive materials. For example, when the first division layer 34 is formed of ITO, the second division layer 35 may be formed of a transparent conductive material such as IZO or IGZO. In addition, when the first division layer 34 is formed of IZO or IGZO, the second division layer 35 may be formed of ITO. When the first and second division layers 34 and 35 are formed of different transparent conductive materials, this may allow only the second division layer 35 to be selectively etched, thereby forming the first electrode.

The third division layer 36 may be formed of a metal such as, for example, molybdenum (Mo), aluminum (Al), chrome (Cr), gold (Au), titanium (Ti), nickel (Ni), neodymium (Nd) or copper (Cu).

Figure 2D:
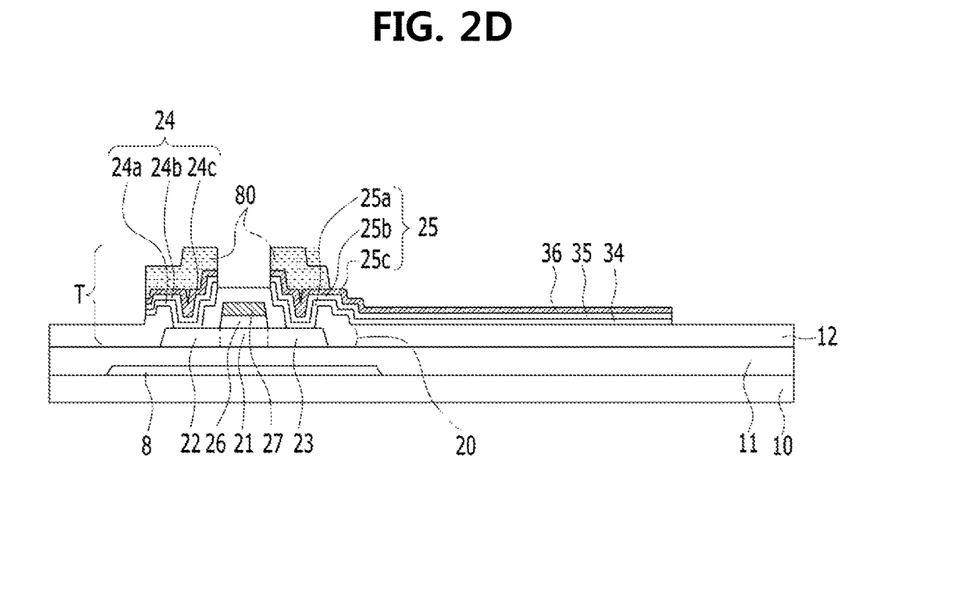

Subsequently, the source electrode 24 and the drain electrode 25 are formed via a patterning process, as illustrated in FIG. 2D. Then, a portion of the photoresist 80 on the source electrode 24 and the drain electrode 25 is removed via, for example, ashing, and the photoresist 80 remaining on the third division layer 36 is removed.

Figure 2E:
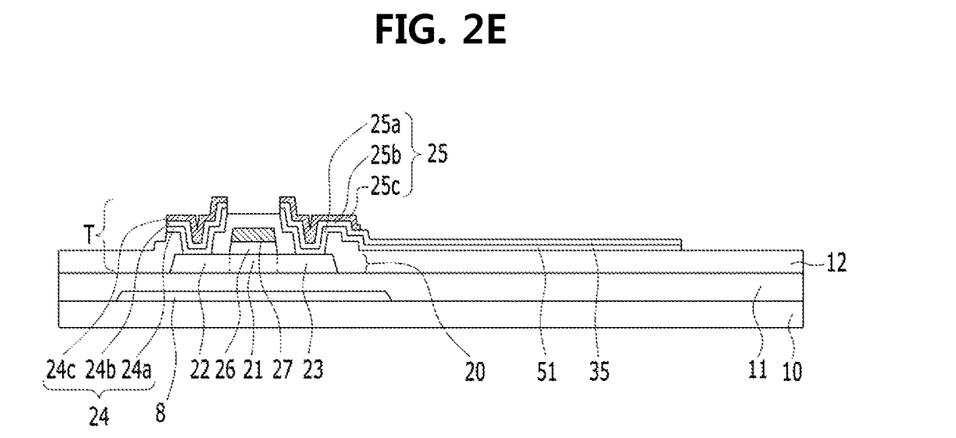

Subsequently, as illustrated in FIG. 2E, the first electrode 51 is formed by patterning the third division layer in the area in which the first electrode 51 is to be located. The second division layer 35 still remains on the first electrode 51.

Figure 2F:
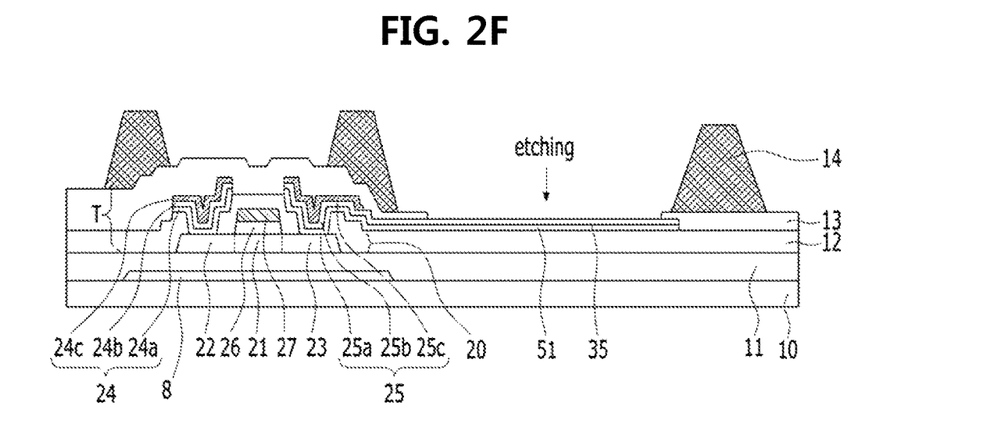

Subsequently, as illustrated in FIG. 2F, after the passivation layer 13 is formed on the thin-film transistor T via a mask process, the bank insulation layer 14 is formed on the passivation layer 13 via a mask process.

The passivation layer 13 may be formed in a single inorganic layer or in multiple inorganic layers using a hydrophilic material such as, for example, SiOx or SiNx. The passivation layer 13 serves to protect the thin-film transistor T, and in the embodiment, also serves to define the emission area E.

Examples of a material that may constitute the bank insulation layer 14 may include any one or a mixture of two or more selected from among polyimide, styrene, metylmethacrylate, and polytetrafluoroethylene.

Subsequently, the second division layer 35 located on the first electrode 51 is patterned to expose the first electrode 51. Impurities scattered in the process of forming the passivation layer 13 and the bank insulation layer 14 may be attached to the second division layer 35. In the organic light-emitting display device according to the present invention, since the second division layer 35 is removed after the passivation layer 13 and the bank insulation layer 14 are formed, the impurities attached to the second division layer 35 are removed, and the first electrode 51 has a clean surface having no impurities. Then, a portion of the second division layer 35 is provided as the middle layer portion 25b of the drain electrode 25 and is exposed through the side surface of the passivation layer 13.

Figure 2G:
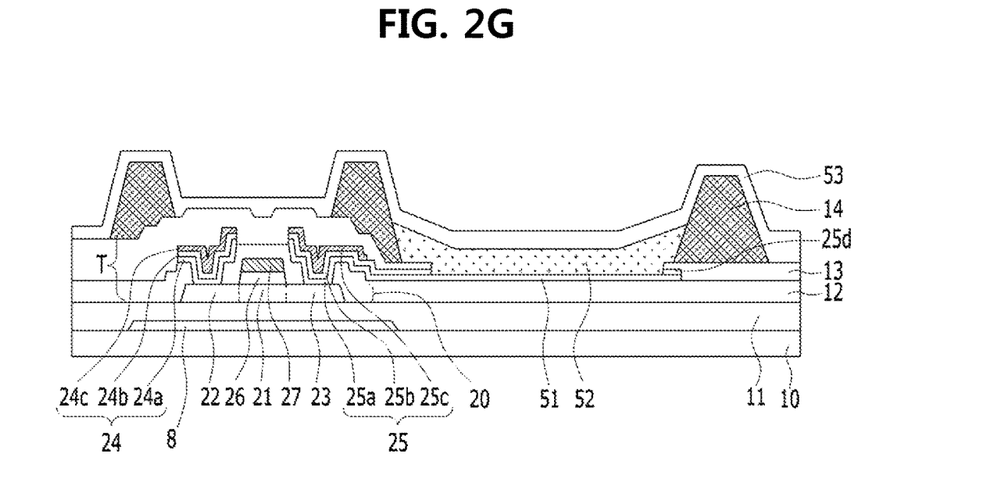

Referring to FIG. 2G, the organic light-emitting layer 52 is provided on the first electrode 51. Here, the organic light-emitting layer 52 may include a hole injection layer (HIL), a hole transport layer (HTL), an emission layer (EML), an electron transport layer (ETL) and an electron injection layer (EIL). In addition, the organic light-emitting layer 52 may further include at least one functional layer configured to increase, for example, the luminous efficacy and lifespan of the emission layer, for example, a charge-generating layer, which generates a charge, an additional electron transport layer and an additional hole transport layer.

Here, the organic light-emitting layer 52 is formed by a solution process such as inkjet printing or nozzle coating. The organic light-emitting layer formed using the solution process undergoes a pile-up phenomenon in which the organic light-emitting layer is relatively slowly cured in the edge portion thereof, which is in contact with the bank insulation layer 14 and begins to be cured from the central portion thereof, whereby the constituent material of the organic light-emitting layer 52 moves to the edge portion and the edge portion is finally cured, thus causing the edge portion of the organic light-emitting layer 52 to be thicker than the central portion. Accordingly, in the organic light-emitting display device according to the embodiment, the edge portion of the organic light-emitting layer 52 is thicker than the central portion of the organic light-emitting layer 52. However, in the embodiment, since the passivation layer 13 is located below the edge portion of the organic light-emitting layer 52, the passivation layer 13 may guide a liquid-phase material, which is used to form the organic light-emitting layer 52, to the central portion, which may reduce the extent to which the thickness of the edge portion of the organic light-emitting layer 52 is increased. In addition, the side surface of the organic light-emitting layer 52 is formed so as to come into contact with the middle layer portion 25*b* of the drain electrode 25. In addition, the dummy conductive layer 25*d* may further be provided below the passivation layer 13 at one side of the organic light-emitting layer 52 opposite the drain electrode 25. The dummy conductive layer 25*b* is a portion that remains after the second division layer 35 is removed. The end of the dummy conductive layer 25*d* is also in contact with the side surface of the organic light-emitting layer 52.

Subsequently, the second electrode 53 is provided on the organic light-emitting layer 52. The second electrode 53 is provided to cover the top of the organic light-emitting layer 52 and the bank insulation layer 14.

As described above, in the organic light-emitting display device according to the present invention, since the organic light-emitting layer 52 is formed in a state in which impurities such as, for example, particulates, which are generated in the process of forming the bank insulation layer 14 and are attached to the middle layer portion 25*b* of the drain electrode 25, are wholly removed in the process of patterning the middle layer portion 25*b* of the drain electrode 25 and no impurities remain on the surface of the first electrode 51, the adhesion strength between the first electrode 51 and the organic light-emitting layer 52 may be increased.

In addition, since the passivation layer 13 serves as a hydrophilic bank in the organic light-emitting display device according to the embodiment, the organic light-emitting display device may be formed without forming an additional bank insulation layer or planarization layer. In addition, since the organic light-emitting layer 52 of the organic light-emitting display device according to the embodiment is formed using a solution process, it is unnecessary to provide a mask for a deposition process.

Accordingly, the organic light-emitting display device according to one embodiment may entail a simplified manufacturing process and reduced manufacturing costs by greatly reducing the number of masks, compared to the related art.

In addition, in the organic light-emitting display device according to one embodiment, since the passivation layer 13 extends to the bottom of the organic light-emitting layer 52 and forms a slope on the edge portion of the organic light-emitting layer 52, a liquid-phase material that is to form the organic light-emitting layer is guided to gather to the central portion of the organic light-emitting layer 52, which alleviates a pile-up phenomenon when the organic light-emitting layer 52 is formed by a solution process.

It will be apparent to those skilled in the art that various modifications and variations can be made in the organic light-emitting display device and the method of manufacturing the same of the present invention without departing from the spirit or scope of the invention. Thus, it is intended that the present invention cover the modifications and variations of this invention provided they come within the scope of the appended claims and their equivalents.

What is claimed is:

1. An organic light-emitting display device, comprising:
a semiconductor layer on a substrate, the semiconductor layer including a source area, a drain area and a channel area;
a gate insulation layer on the channel area of the semiconductor layer, and a gate electrode on the gate insulation layer overlapping the channel area;
an interlayer insulation layer on the substrate and the gate electrode, the interlayer insulation layer having a first contact hole configured to expose the source area and a second contact hole configured to expose the drain area;
a source electrode connected to the source area through the first contact hole area, and a drain electrode connected to the drain area through the second contact hole;
a first electrode formed by extending a portion of one of the source electrode and the drain electrode;
a passivation layer on the substrate so as to cover the source electrode and the drain electrode, the passivation layer being configured to expose the first electrode;
a bank insulation layer on the passivation layer;
an organic light-emitting layer on the first electrode; and
a second electrode on the organic light-emitting layer,
wherein each of the source electrode and the drain electrode includes a lower layer portion, a middle layer portion, which are formed of different transparent conductive materials, and an upper layer portion, which is formed of a metal material,
wherein the first electrode is integrally formed with one of the lower layer portion of the source electrode and the lower layer portion of the drain electrode, and
wherein the passivation layer is formed of a hydrophilic inorganic insulation material, and the bank insulation layer is formed of a hydrophobic organic insulation layer.

2. The device according to claim 1, wherein the passivation layer is provided so as to extend to a bottom of an edge portion of the organic light-emitting layer.

3. The device according to claim 2, wherein the organic light-emitting layer has a greater height in the edge portion thereof than a height in a central portion thereof.

4. The device according to claim 2, wherein:
the middle layer portion of the source electrode or the drain electrode is provided below the passivation layer so as to extend to the bottom of the edge portion of the organic light-emitting layer, and a side surface end of the middle layer portion of the source electrode or the drain electrode contacts with the organic light-emitting layer.

5. The device according to claim 4, further comprising:
a dummy conductive layer provided between an edge of the passivation layer and an edge of the first electrode being below an edge of the organic light-emitting layer,
wherein a side surface of the dummy conductive layer contacts the organic light-emitting layer, and
the dummy conductive layer is in a same layer as the middle layer portion.

6. The device according to claim 1, wherein the lower layer portion is formed of indium tin oxide (ITO), and the middle layer portion is formed of indium gallium zinc oxide (IGZO) or indium zinc oxide (IZO).

7. The device according to claim 1, wherein the lower layer portion is formed of indium gallium zinc oxide (IGZO) or indium zinc oxide (IZO), and the middle layer portion is formed of indium tin oxide (ITO).

8. The device according to claim 1, wherein the lower layer portion is formed of a first transparent conductive material, the middle layer portion is formed of a second transparent conductive material different to the first transparent conductive material on the lower layer portion, and the upper layer portion is formed on the middle layer portion.

* * * * *